(12) United States Patent
Park et al.

(10) Patent No.: US 7,928,435 B2
(45) Date of Patent: Apr. 19, 2011

(54) INTERPOSER CHIP AND MULTI-CHIP PACKAGE HAVING THE INTERPOSER CHIP

(75) Inventors: Sung-Yong Park, Seongnam-si (KR); Tae-Je Cho, Yongin-si (KR); Tae-Hun Kim, Cheonan-si (KR); Jong-Kook Kim, Hwaseong-si (KR); Byeong-Yeon Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/453,144

(22) Filed: Apr. 30, 2009

(65) Prior Publication Data
US 2009/0272974 A1    Nov. 5, 2009

(30) Foreign Application Priority Data

Apr. 30, 2008   (KR) ........................ 10-2008-0040579

(51) Int. Cl.
*H01L 23/58*    (2006.01)
(52) U.S. Cl. ................... 257/48; 257/260; 257/E23.002
(58) Field of Classification Search ............... 257/48, 257/E23.002; 174/260
See application file for complete search history.

(56) References Cited

U.S. PATENT DOCUMENTS

| 4,951,098 A * | 8/1990 | Albergo et al. ................. 257/48 |
| 2004/0245651 A1* | 12/2004 | Nishisako et al. ............ 257/777 |
| 2006/0131718 A1* | 6/2006 | Tao et al. ...................... 257/686 |

FOREIGN PATENT DOCUMENTS

| JP | 2007-103411 | 4/2007 |
| KR | 10-2006-0074796 | 7/2006 |
| KR | 10-0723518 | 5/2007 |

* cited by examiner

*Primary Examiner* — Tan N Tran
(74) *Attorney, Agent, or Firm* — Harness, Dickey & Pierce, P.L.C.

(57) ABSTRACT

An interposer chip may include an insulating substrate, conductive patterns, and a test pattern. The conductive patterns may be formed on the insulating substrate. Further, the conductive patterns may be electrically connected to conductive wires. The test pattern may be connected to the conductive patterns. A test current for testing an electrical connection between the conductive patterns and the conductive wires may flow through the test pattern. Thus, the interposer chip may have the test pattern connected to the conductive patterns, so that the test current may flow to the test pattern through the conductive wires and the conductive patterns. As a result, an electrical connection between the conductive wires and the conductive patterns may be identified based on the test current supplied to the test pattern.

22 Claims, 2 Drawing Sheets

INTERPOSER CHIP AND MULTI-CHIP PACKAGE HAVING THE INTERPOSER CHIP

PRIORITY STATEMENT

This application claims priority under 35 U.S.C. §119 to Korean Patent Application No. 10-2008-0040579, filed on Apr. 30, 2008, in the Korean Intellectual Property Office (KIPO), the entire contents of which are herein incorporated by reference.

BACKGROUND

1. Field

Example embodiments relate to an interposer chip and a multi-chip package having the interposer chip. More particularly, example embodiments relate to an interposer chip that may be used for electrically connecting two semiconductor chips, which may have different sizes, with each other. Example embodiments also relate to a multi-chip package having the interposer chip.

2. Description of the Related Art

Various semiconductor fabrication processes may be performed on a semiconductor substrate to form a plurality of semiconductor chips. Packaging processes may be performed on the semiconductor chips to form semiconductor packages. In order to increase a storage capacity of the semiconductor packages, multi-chip packages may be formed to include a plurality of stacked semiconductor chips. The stacked semiconductor chips may be electrically connected to each other via conductive wires. However, if the semiconductor chips have different sizes, directly connecting the stacked semiconductor chips with each other using the conductive wires may be difficult due to a length limit of the conductive wire.

Interposer chips may be used to electrically connect semiconductor chips having different sizes. A conventional interposer chip may include an insulating substrate and conductive patterns formed on the insulating substrate. The conductive patterns and the semiconductor chips may be electrically connected with each other via the conductive wires. However, because conventional interposer chips may not have a common pad, an electrical connection between conductive wires and a conductive pattern may not be accurately identified. That is, whether a test current may flow or not to the conductive pattern through the conductive wire may not be identified when the conductive wire is connected to the conductive pattern.

SUMMARY

Example embodiments provide an interposer chip that may be capable of identifying an electrical connection between a conductive wire and a conductive pattern. Example embodiments also provide a multi-chip package having the interposer chip.

In accordance with example embodiments, an interposer chip may include an insulating substrate, a plurality of conductive patterns on the insulating substrate and configured to connect to a plurality of conductive wires, and a test pattern connected to the plurality of conductive patterns to allow a test current to flow from at least one of the conductive patterns among the plurality of conductive patterns through the test pattern.

According to example embodiments, there is provided an interposer chip. The interposer chip may include an insulating substrate, conductive patterns and a test pattern. The conductive patterns may be formed on the insulating substrate. Further, the conductive patterns may be electrically connected to conductive wires. The test pattern may be connected to the conductive patterns. A test current for testing an electrical connection between the conductive patterns and the conductive wires may flow through the test pattern.

In example embodiments, the test pattern may include a plurality of test lines extending from the conductive patterns, and a common line connected between ends of the test lines.

In example embodiments, the test pattern may further include a one-way element formed on the test lines to induce the test current from the conductive patterns toward the test pattern. The one-way element may include, for example, a diode or a capacitor.

In example embodiments, the test pattern may further include a common pad formed on the common line. The common pad may make contact with a tester for testing the flow of the test current. The common pad may include a ground pad included in the conductive pattern.

According to example embodiments, there is provided an interposer chip. The interposer chip may include an insulating substrate, conductive patterns, test lines, one-way element, a common line and a common pad. The conductive patterns may be formed on the insulating substrate. The conductive patterns may confront each other. Further, the conductive patterns may be electrically connected to conductive wires. The test lines may extend from the conductive patterns. A test current for testing an electrical connection between the conductive patterns and the conductive wires may flow through the test lines. The one-way element may be formed on the test lines to induce the test current from the conductive patterns toward the test lines. The common pad may be formed on the common line. The common pad may make contact with a tester for testing the flow of the test current.

According to example embodiments, there is provided an interposer chip. The interposer chip may include an insulating substrate, signal pads, signal lines, ground pads, a ground line, a test line and a one-way element. The signal pads may be formed on the insulating substrate. The signal pads may confront each other. Further, the signal pads may be electrically connected to conductive wires. The ground pads may be formed on the insulating substrate. The ground pads may confront each other. The ground line may be connected between the ground pads. The test lines may be connected between the signal lines and the ground line. A test current for testing an electrical connection between the signal pads and the conductive wires may flow through the test lines. The one-way element may be formed on the test lines to induce the test current from the signal pads toward the test lines. Here, the ground pads may function as a common pad with which a tester for testing the flow of the test current may make contact.

According to example embodiments, there is provided a multi-chip package. The multi-chip package may include a first semiconductor chip, a second semiconductor chip and an interposer chip. The second semiconductor chip may be located over the first semiconductor chip. The interposer chip may include an insulating substrate, conductive patterns and a test pattern. The insulating substrate may be interposed between the first semiconductor chip and the second semiconductor chip. The conductive patterns may be formed on the insulating substrate. Further, the conductive patterns may be electrically connected to the first semiconductor chip and the second semiconductor chip. The test pattern may be connected to the conductive patterns. A test current for testing an electrical connection between the conductive patterns and the first and the second semiconductor chips may flow through the test pattern.

In example embodiments, the first semiconductor chip and the interposer chip, and the interposer chip and the second semiconductor chip may be electrically connected with each other via conductive wires.

According to example embodiments, the interposer chip may have the test pattern connected to the conductive patterns. Thus, the test current may flow to the test pattern through the conductive wires and the conductive patterns. As a result, an electrical connection between the conductive wires and the conductive patterns may be identified based on the test current supplied to the test pattern.

BRIEF DESCRIPTION OF THE DRAWINGS

Example embodiments will be more clearly understood from the following detailed description taken in conjunction with the accompanying drawings.

FIG. 1 is a plan view illustrating an interposer chip in accordance with example embodiments;

FIG. 2 is a plan view illustrating an interposer chip in accordance with example embodiments;

FIG. 3 is a plan view illustrating a multi-chip package including the interposer chip in FIG. 1; and FIG. 4 is a cross-sectional view taken along a line IV-IV' in FIG. 3.

DETAILED DESCRIPTION OF EXAMPLE EMBODIMENTS

Figure 1:
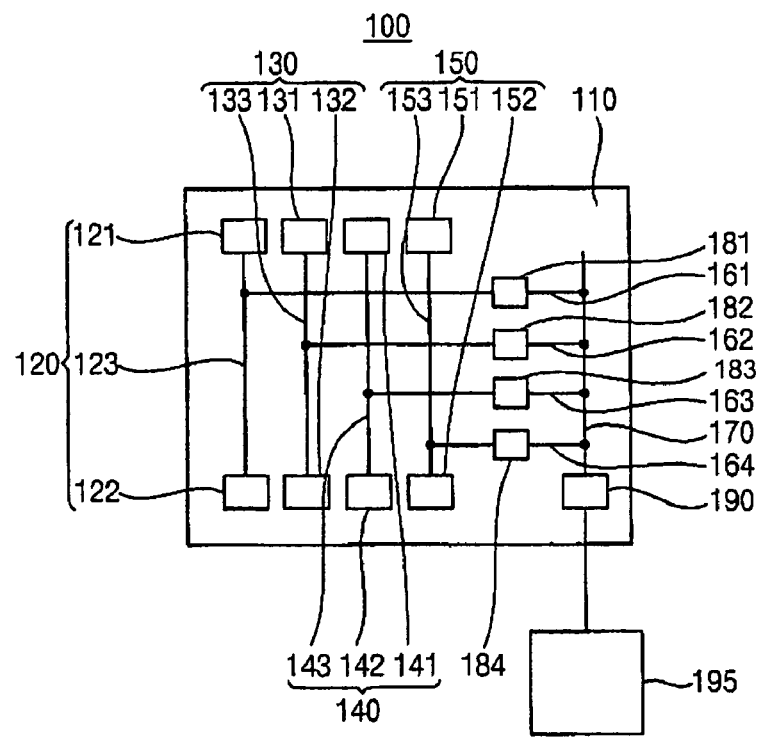
FIGS. 1 to 4 represent non-limiting, example embodiments as described herein.

Example embodiments will be described more fully hereinafter with reference to the accompanying drawings, in which example embodiments are shown. Example embodiments may, however, be embodied in many different forms and should not be construed as limited to the example embodiments set forth herein. Rather, example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers that may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing example embodiments only and is not intended to be limiting. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Hereinafter, example embodiments will be explained in detail with reference to the accompanying drawings.

FIG. 1 is a plan view illustrating an interposer chip in accordance with example embodiments. Referring to FIG. 1, an interposer chip 100 according to example embodiments may include an insulating substrate 110, a first conductive pattern 120, a second conductive pattern 130, a third conductive pattern 140, a fourth conductive pattern 150, and a test pattern.

In example embodiments, the insulating substrate 110 may have a rectangular flat shape. Further, the insulating substrate 110 may include an oxide. The insulating substrate 110 may be interposed between stacked semiconductor chips having different sizes.

The first conductive pattern 120, the second conductive pattern 130, the third conductive pattern 140, and the fourth conductive pattern 150 may be arranged on the insulating substrate 110 along a horizontal direction by substantially the same horizontal interval. In other words, the first, second, third, and fourth conductive patterns 120, 130, 140, and 150 may be equally spaced in a horizontal direction.

The first conductive pattern 120 may include a first contact pad 121, a second contact pad 122, and a first conductive line 123. The first contact pad 121 and the second contact pad 122 may be electrically connected via the first conductive line 123. In example embodiments, the first conductive pattern 120 may include a conductive material, for example, tungsten, aluminum, and/or copper.

The second conductive pattern 130 may be arranged to the right of the first conductive pattern 120. The second conductive pattern 130 may include a third contact pad 131, a fourth contact pad 132, and a second conductive line 133. The second conductive pattern 130 may have an arrangement substantially the same as that of the first conductive pattern 120. As shown in FIG. 1, the second conductive pattern 130 may be formed so that the third contact pad 131, the fourth contact pad 132, and the second conductive line 133 are to the right of the first contact pad 121, the second contact pad 122, and the first conductive line 123, respectively. Further, the second conductive pattern 130 may be arranged so that the second conductive line 133 is parallel to the first conductive line 123. Because the arrangement of the second conductive pattern 130 may be substantially the same as that of the first conductive pattern 120, any further illustrations with respect to the second conductive pattern 130 may be omitted herein for brevity.

The third conductive pattern 140 may be arranged to the right of the second conductive pattern 130. The third conductive pattern 140 may include a fifth contact pad 141, a sixth contact pad 142, and a third conductive line 143. The third conductive pattern 140 may have an arrangement substantially the same as that of the first conductive pattern 120. As shown in FIG. 1, the third conductive pattern 140 may be formed so that the fifth contact pad 141, the sixth contact pad 142, and the third conductive line 143 are to the right of the third contact pad 131, the fourth contact pad 132 and the second conductive line 133, respectively. Further, the third conductive pattern 140 may be arranged so that the third conductive line 143 is parallel to the second conductive line 133. Because the arrangement of the third conductive pattern 140 may be substantially the same as that of the first conductive pattern 120, any further illustrations with respect to the third conductive pattern 140 may be omitted herein for brevity.

The fourth conductive pattern 150 may be arranged to the right of the third conductive pattern 140. The fourth conductive pattern 150 may include a seventh contact pad 151, an eighth contact pad 152, and a fourth conductive line 153. The fourth conductive pattern 150 may have an arrangement substantially the same as that of the first conductive pattern 120. As shown in FIG. 1, the fourth conductive pattern 150 may be formed so that the seventh contact pad 151, the eighth contact pad 152, and the fourth conductive line 153 are to the right of the fifth contact pad 141, the sixth contact pad 142 and the third conductive line 143, respectively. Further, the fourth conductive pattern 150 may be arranged so that the fourth conductive line 153 is parallel to the third conductive line 143. Because the arrangement of the fourth conductive pattern 150 may be substantially the same as that of the first conductive pattern 120, any further illustrations with respect to the fourth conductive pattern 150 may be omitted herein for brevity.

As shown in FIG. 1, the first contact pad 121, the third contact pad 131, the fifth contact pad 141, and the seventh contact pad 151 may be formed in a first line on the insulating substrate 110 and the second contact pad 122, the fourth contact pad 132, the sixth contact pad 142, and the eighth contact pad 152 may be formed in a second line that may be parallel to the first line. The distances separating the first contact pad 121 from the third contact pad 131, the third contact pad 131 from the fifth contact pad 141, and the fifth contact 141 pad from the seventh contact pad 151 may be substantially the same. The distance separating the second contact pad 122 from the fourth contact pad 132 may be about the same distance as the distance separating the first contact pad 121 from the third contact pad 131. The distance separating the fourth contact pad 132 from the sixth contact pad 142 may be about the same distance as the distance separating the third contact pad 131 from the fifth contact pad 141. The distance separating the sixth contact pad 142 from the eighth contact pad 152 may be about the same distance as the distance separating the fifth contact pad 141 from the seventh contact pad 151. Further, the first contact pad 121, the second contact pad 122, the seventh contact pad 151 and the eighth contact pad 152 may be arranged so as to form a rectangle.

As shown in FIG. 1, four conductive patterns may be formed on the insulating substrate. However, example embodiments are not limited thereto and the numbers of the conductive patterns may vary in accordance with numbers of pads on the semiconductor chips between which the interposer chip 100 may be interposed.

The test pattern may be electrically connected to the first conductive pattern 120, the second conductive pattern 130, the third conductive pattern 140, and the fourth conductive pattern 150. A test current, for testing electrical connections between the first to the fourth conductive patterns 120, 130, 140, 150 and conductive wires illustrated later, may flow through the test pattern. A tester 195 for detecting the test current may be electrically connected to the test pattern.

The test pattern may include a first test line 161, a second test line 162, a third test line 163, a fourth test line 164, a common line 170, a first one-way element 181, a second one-way element 182, a third one-way element 183, a fourth one-way element 184 and a common pad 190.

The common line 170 may be formed on the insulating substrate to the right of the fourth conductive pattern 150. As shown in FIG. 1, the common line 170 may be formed to be parallel to the first conductive line 123, the second conductive line 133, the third conductive line 143, and the fourth conductive line 153. The first test line 161 may extend on the insulating substrate 110 from the first conductive line 123 to the common line 170. The second test line 162 may extend on the insulating substrate 110 from the second conductive line 133 to the common line 170. The third test line 163 may extend on the insulating substrate 110 from the third conductive line 143 to the common line 170. The fourth test line 164 may extend on the insulating substrate 110 from the fourth conductive line 153 to the common line 170. That is, left ends of the first test line 161, the second test line 162, the third test line 163, and the fourth test line 164 may be connected to the first conductive line 123, the second conductive line 133, the third conductive line 143, and the fourth conductive line 153, respectively.

The first test line 161, the second test line 162, the third test line 163 and the fourth test line 164 may not intersect with each other. For example, the first test line 161, the second test line 162, the third test line 163 and the fourth test line 164 may be arranged in parallel with each other. Further, portions of the first test line 161, the second test line 162, and the third test line 163, as measured from the fourth conductive line 153 to the common line 170, may be substantially the same as a length of the fourth test line 164. Thus, the first test line 161 may have the longest length and the fourth test line 164 may have the shortest length. As a result, the right ends of the first test line 161, the second test line 162, the third test line 163, and the fourth test line 164 may lie on a straight line that may be substantially parallel with the first conductive line 123, the second conductive line 133, the third conductive line 143, and the fourth conductive line 153.

The common line 170 may be arranged on the insulating substrate 110. The common line 170 may be connected between the right ends of the first test line 161, the second test line 162, the third test line 163, and the fourth test line 164. Therefore, the common line 170 may be substantially parallel with the first conductive line 123, the second conductive line 133, the third conductive line 143 and the fourth conductive line 153.

Because the first test line 161, the second test line 162, the third test line 163 and the fourth test line 164 may be connected with each other via the common line 170, the test current, which may flow through any one of the test lines 161, 162, 163 and 164 from any one of the contact pads 121, 122, 131, 132, 141, 142, 151 and 152, may be supplied to other contact pads through the other test lines as well as the tester 195.

To prevent or reduce the supply of the test current to the other contact pads, the first one-way element 181, the second one-way element 182, the third one-way element 183, and the fourth one-way element 184 may be arranged on the first test line 161, the second test line 162, the third test line 163, and the fourth test line 164, respectively. The first one-way element 181, the second one-way element 182, the third one-way element 183 and the fourth one-way element 184 may allow the test current, which may flow through the first test line 161, the second test line 162, the third test line 163, and the fourth test line 164, to flow only toward the tester 195. In accordance with example embodiments, the first one-way element 181, the second one-way element 182, the third one-way element 183 and the fourth one-way element 184 may include a diode and/or a capacitor or any other electrical component allowing for one-way current flow.

The common pad 190 may be formed at an end of the common line 170. The tester 195 may be electrically connected to the common pad 190. Thus, the tester 195 may detect the test current flowing through the common line 170, so that the electrical connections between the first to the fourth conductive patterns 120, 130, 140 and 150 and the conductive wires may be identified.

According to example embodiments, the conductive patterns may be electrically connected to the test pattern. Therefore, the electrical connections between the conductive patterns and the conductive wires may be identified based on the test current supplied from the conductive patterns to the test pattern.

Figure 2:
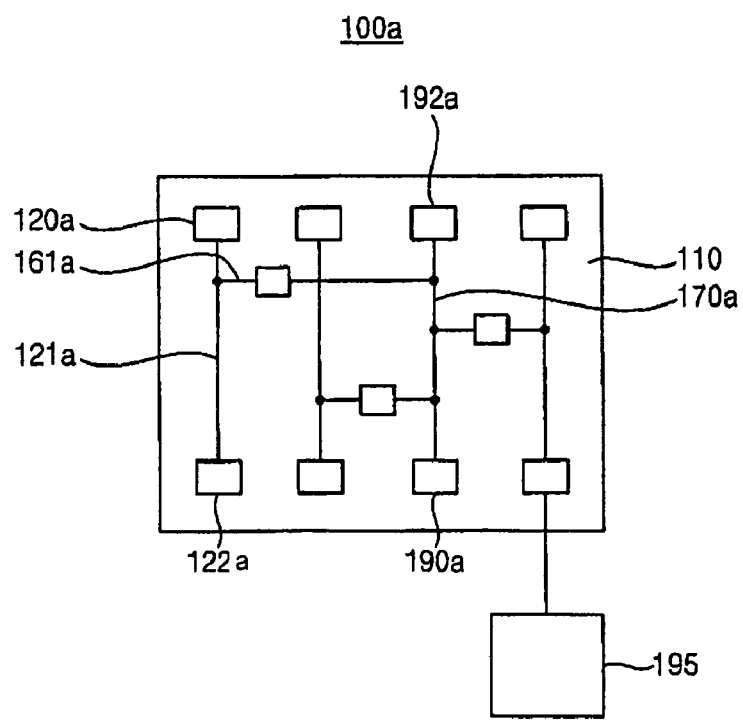

FIG. 2 is a plan view illustrating an interposer chip in accordance with example embodiments. Referring to FIG. 2, an interposer chip 100a according to example embodiments may include an insulating substrate 110, signal pads 120a and 122a, signal lines 121a, ground pads 190a and 192a, a ground line 170a, test lines 161a, and one-way elements 180a.

The signal pads 120a and 122a and the ground pads 190a and 192a may correspond to the contact pads of the conductive patterns according to example embodiments. For example, any one of the conductive patterns illustrated in FIG. 1 may function as the ground pads 190a and 192a and the ground line 170a. Thus, because the ground pads 190a and 192a may be connected to all of the signal pads 120a and 122a, the ground pads 190a and 192a may be used as the common pad without using of a separate common pad. As a result, the interposer chip 100a illustrated in FIG. 2 may include two common pads.

The signal lines 121a may be connected between the signal pads 120a and 122a confronting each other and the ground line 170a may be connected between the ground pads 190a and 192a. The signal lines 121a may correspond to the conductive lines illustrated in FIG. 1 and the ground line 170a may correspond to the common line illustrated in FIG. 1.

The test lines 161a may be connected between the signal lines 121a and the ground line 170a. The one-way elements 180a may be provided with the test lines 161a, respectively. The test lines 161a and the one-way elements 180a may be similar to those illustrated in FIG. 1. Thus, any further illustrations with respect to the test lines 161a and the one-way elements 180a may be omitted herein for brevity.

According to example embodiments, when any one of the conductive patterns is used for grounding, the ground pad may be used for testing electrical connections between the conductive patterns and the conductive wires without using the common line and the common pad.

Figure 3:
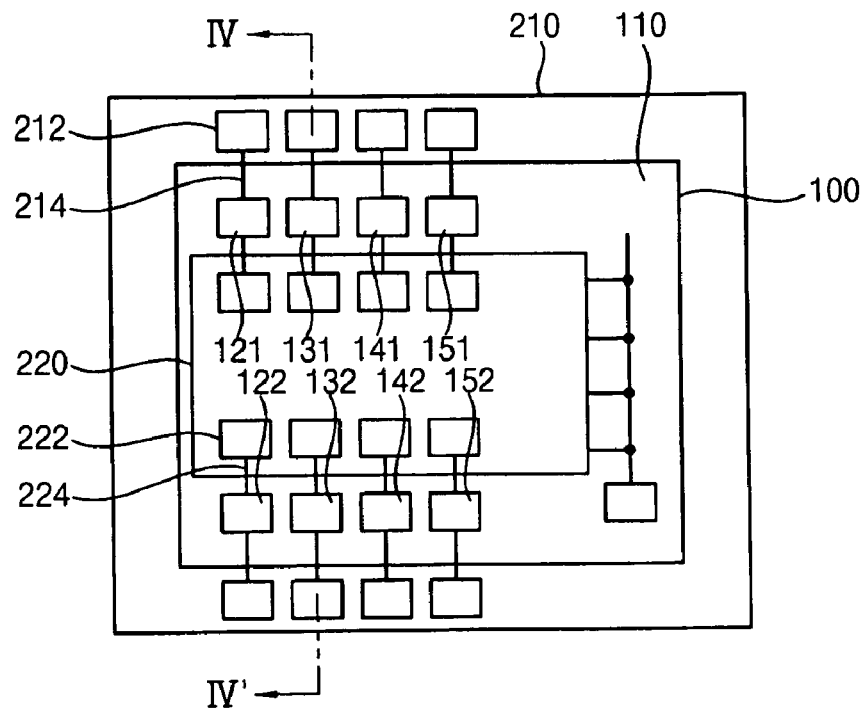
Figure 4:
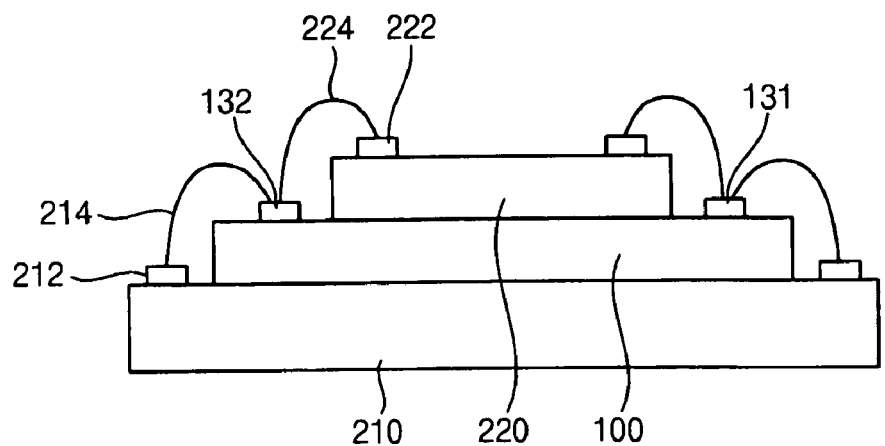

FIG. 3 is a plan view illustrating a multi-chip package that may include the interposer chip illustrated in FIG. 1, and FIG. 4 is a cross-sectional view taken along a line IV-IV' in FIG. 3. Referring to FIGS. 3 and 4, a multi-chip package 200 according to example embodiments may include a first semiconductor chip 210, an interposer chip 100 and a second semiconductor chip 220. The interposer chip 100 may be similar to the interposer chip 100 illustrated in FIG. 1. Thus, any further illustrations with respect to the interposer chip 100 may be omitted herein for brevity.

The first semiconductor chip 210 may be placed under the interposer chip 100. Additionally, the first semiconductor chip 210 may be attached to an upper surface of a printed circuit board (PCB) (not shown). The first semiconductor chip 210 may have pads 212 electrically connected to pads of the PCB. In accordance with example embodiments, the pads 212 of the first semiconductor chip 210 may be electrically connected to the pads of the PCB via conductive wires. Further, the first semiconductor chip 210 may have a size less than that of the PCB.

The interposer chip 100 may be attached to an upper surface of the first semiconductor chip 210. The contact pads 121, 122, 131, 132, 141, 142, 151 and 152 of the interposer chip 100 may be electrically connected to the pads 212 of the first semiconductor chip 210 via the conductive wires 214. In accordance with example embodiments, the interposer chip 100 may have a size less than that of the first semiconductor chip 210.

The second semiconductor chip 220 may be attached to an upper surface of the interposer chip 100. The second semiconductor chip 220 may have pads 222 electrically connected to the contact pads 121, 122, 131, 132, 141, 142, 151 and 152 of the interposer chip 100 via conductive wires 224. The interposer chip 100 may have a size greater than that of the second semiconductor chip 220.

In accordance with example embodiments, the multi-chip package 200 may include the interposer chip 100 illustrated in FIG. 1. Alternatively, the example multi-chip package 200 may include the interposer chip 100a illustrated in FIG. 2. Accordingly, the interposer chip 100 may include a test pattern. Thus, electrical connections between the conductive wires and the contact pads may be identified.

According to example embodiments, an interposer chip may have a test pattern connected to the conductive patterns. Thus, a test current may flow to the test pattern through the conductive wires and the conductive patterns. As a result, an electrical connection between the conductive wires and the conductive patterns may be identified based on the test current supplied to the test pattern. Therefore, an electrically disconnected conductive wire may be rapidly repaired.

While example embodiments have been particularly shown and described with reference to example embodiments thereof, it will be understood by those of ordinary skill in the art that various changes in form and details may be made therein without departing from the spirit and scope of the following claims.

What is claimed is:

1. An interposer chip comprising:
an insulating substrate;
a plurality of conductive patterns on the insulating substrate and configured to connect to a plurality of conductive wires; and
a test pattern connected to the plurality of conductive patterns to allow a test current to flow from at least one of the conductive patterns among the plurality of conductive patterns through the test pattern, wherein each of the conductive patterns among the plurality of conductive patterns comprises a pair of contact pads on the insulating substrate, each contact pad being configured to connect to a conductive wire, and a conductive line connecting the pair of contact pads,
the plurality of conductive patterns includes a first contact pad and a second contact pad and a first conductive line connecting the first contact pad to the second contact pad, and
the test pattern includes a test line connected to the first conductive line, the test line connecting to the first conductive line in a region of the first conductive line between the first contact pad and the second contact pad, the test line being configured to connect to a tester.

2. The interposer chip of claim 1, further comprising:
a ground pad on the insulating substrate; and
a ground line on the insulating substrate, wherein the ground pad and the ground line are electrically connected and the ground line is between two of the conductive lines of the plurality of conductive patterns.

3. The interposer chip of claim 2, wherein the test pattern comprises:
a plurality of test lines extending from the conductive lines of the plurality of conductive patterns to the ground line.

4. The interposer chip of claim 1, wherein each of the conductive patterns of the plurality of conductive patterns are spaced equidistant from one another.

5. The interposer chip of claim 1, further comprising:
ground pads on the insulating substrate, the ground pads configured to connect to the tester for identifying a test current; and
a ground line connected to the ground pads, wherein the contact pads are signal pads and the conductive lines are signal lines such that each pair of signal pads is connected by a signal line and the test pattern includes a plurality of test lines connecting the signal lines to the ground line, each test line among the plurality of test lines includes a one-way element to allow the test current to flow in only one direction.

6. The interposer chip of claim 5, wherein each one-way element is one of a diode or a capacitor.

7. The interposer chip of claim 5, wherein at least two of the test lines of the plurality of test lines are equal in length.

8. The interposer chip of claim 5, wherein the ground line is between two signal lines of the plurality of signal lines.

9. A multi-chip package comprising:
the interposer chip of claim 1;
a first semiconductor chip attached to a bottom surface of the interposer chip; and
a second semiconductor chip attached to a top surface of the interposer chip.

10. The multi-chip package chip of claim 9, wherein the first semiconductor chip and the interposer chip, and the interposer chip and the second semiconductor chip, are electrically connected with each other via a plurality of conductive wires.

11. The multi-chip package of claim 10, further comprising:
two ground pads connected by a ground line on the insulating substrate, wherein the two ground pads and ground line are between at least two conductive patterns of the plurality of conductive patterns.

12. The multi-chip package of claim 11, wherein at least two of the test lines of the plurality of test lines are equal in length.

13. The multi-chip package of claim 10, wherein the test pattern comprises:
a plurality of test lines extending from the plurality of conductive patterns; and
a common line connected between ends of the plurality of test lines.

14. The multi-chip package of claim 13, wherein each of the test lines among the plurality of test lines includes a one-way element configured to allow the test current to flow in only one direction.

15. The interposer chip of claim 1, wherein
the plurality of conductive patterns, the test pattern, and the conductive line connecting the pair of contact pads are all on the same substrate.

16. The interposer chip of claim 15, wherein, the plurality of conductive patterns, the test pattern, and the conductive line connecting the pair of contact pads are all integral with the same substrate.

17. The interposer chip of claim 1, wherein the test line includes a one-way element.

18. An interposer chip comprising:
an insulating substrate;
a plurality of conductive patterns on the insulating substrate and configured to connect to a plurality of conductive wires; and
a test pattern connected to the plurality of conductive patterns to allow a test current to flow from at least one of the conductive patterns among the plurality of conductive patterns through the test pattern, wherein
each of the conductive patterns among the plurality of conductive patterns comprises
a pair of contact pads on the insulating substrate, each contact pad being configured to connect to a conductive wire, and
a conductive line connecting the pair of contact pads, and
the test pattern comprises
a plurality of test lines extending from the plurality of conductive patterns, and
a common line connected between ends of the plurality of test lines.

19. The interposer chip of claim 18, further comprising:
a common pad on the common line and configured to connect to a tester for identifying a flow of the test current.

20. The interposer chip of claim 18, wherein each of the test lines among the plurality of test lines includes a one-way element configured to allow the test current to flow in only one direction.

21. The interposer chip of claim 20, wherein each of the one-way elements is one of a diode and a capacitor.

22. An interposer chip comprising:

an insulating substrate;

a plurality of conductive patterns on the insulating substrate and configured to connect to a plurality of conductive wires; and a test pattern connected to the plurality of conductive patterns to allow a test current to flow from at least one of the conductive patterns among the plurality of conductive patterns through the test pattern, wherein the test pattern includes a common line and a plurality of one-way elements arranged in a line which is parallel to the common line.

* * * * *